United States Patent [19]

Nottenburg

[11] Patent Number: 5,418,504
[45] Date of Patent: May 23, 1995

[54] TRANSMISSION LINE

[76] Inventor: Richard N. Nottenburg, 16619 Bienveneda Pl., Pacific Palisades, Calif. 90272

[21] Appl. No.: 163,525

[22] Filed: Dec. 9, 1993

[51] Int. Cl.⁶ .............................................. H01P 5/12
[52] U.S. Cl. ................................... 333/1; 333/12; 333/238
[58] Field of Search ................. 333/1, 12, 238, 25, 333/26; 174/36, 117 F, 117 FF

[56] References Cited

U.S. PATENT DOCUMENTS

| | | | |
|---|---|---|---|
| 2,812,501 | 11/1957 | Sommers | 333/238 |
| 4,441,088 | 4/1984 | Anderson | 333/1 |
| 4,639,693 | 1/1987 | Suzuki et al. | 333/1 |
| 4,845,311 | 7/1989 | Schreiber et al. | 174/36 |
| 5,008,639 | 4/1991 | Pavio | 333/116 |
| 5,027,088 | 6/1991 | Shimizu et al. | 333/1 |

OTHER PUBLICATIONS

Grunberger et al, *Longitudinal Field Components and Frequency-Dependent Phase Velocity, etc.*, Electronics Letters, 15 Oct. 1970, vol. 6, No. 21, pp. 683–685.

"High-Density High-Performance Flexible Cables for Digital Applications", A. Deutsch et al., *Electronic Components and Technology Conference Proceedings*, Jun. 1–4, 1993, Orlando, Fla., pp. 647–652.

*Primary Examiner*—Paul Gensler
*Attorney, Agent, or Firm*—Dwight A. Marshall

[57] ABSTRACT

A thin film flexible multi-conductor transmission line having a ground plane deposited on one surface of a flexible thin film insulating member and an array of conductors and pairs of conductors deposited on another surface of the insulating member opposite the ground plane. An electrical shield is positioned above the conductor array to reduce radiation emissions from the conductors into the surrounding environment and to minimize noise sensitivity of the conductors from external emission sources. Insulating material is positioned about sides of and in between the conductors and the shield wherein a ratio of the insulating material height to a height of the conductors is selected at predetermined values and which supports the shield independent of the conductors and insulates each conductor and the conductor array from the shield. Corresponding driver and receiver circuits integrated within the transmission line are each coupled with conductors for transmitting and receiving digital signals on the conductors. A pair of connectors integrated within the transmission line and connected with the driver and receiver circuits couple the transmission line to signal sources and destinations. Interconnected receiver and driver circuits may be integrated within the transmission line at predefined locations along the transmission line conductors and connected thereto for receiving propagated signals appearing on ones of the conductor pairs and to propagate the received signals on others of the conductor pairs.

15 Claims, 2 Drawing Sheets

TRANSMISSION LINE

TECHNICAL FIELD

The invention relates to a transmission line and in particular to a flexible multi-conductor thin film passive and active transmission line structure.

BACKGROUND AND PROBLEM

High performance switching and computation digital electrical systems such as telephone central office switches and centralized computer systems oftentimes require large cable wiring harnesses to interconnect circuit boards, backplanes and frames containing electronic processors and circuitry comprising elements of the systems. Other distributed computer systems, such as work stations and parallel processing computers, need to transmit information between processors, disk drives and other peripherals at data rates capable of supporting transmission of uncompressed high resolution video and data transfer to and from mass storage devices, color printers and displays.

To support operation of these systems, data transmission over distances ranging from 1 to 100 or more meters with a channel data rate of at least 50 Mb/s is essential. Various types of transmission media including cable harnesses of wire conductors, ribbon cables having multiple parallel metallic conductors, optical glass fibers and coaxial cables and transmission lines have been used to interconnect system circuit boards, backplane and frames. Typically, large cable harnesses of wire conductors have been used to interconnect circuit boards, backplanes and frames of telephone switching and computer mainframe systems. For short distances less than 1 meter, flexible ribbon cables having multiple parallel conductors are commonly used inside disk drives and in computer cabinets. Optical and coaxial cables have multiple and single optical fibers and coaxial conductors each commonly used to transmit independent strings of digital signals. Coaxial transmission lines have been used on circuit boards to interconnect circuit board components and to transmit digital signals from one component to another. Strip line cables have also been used to transmit microwave and millimeter wave signals. Typically, such strip line cables have conductors embedded in a dielectric material having a ground plane above and below and which conductors are coupled with driver and receiver circuits. High density and high performance flexible cables using conductors embedded in an insulating material having shields located on one or both sides of the insulating material have been proposed for digital applications.

A problem arises in that loss characteristics of cable harness conductors make them unsuitable for high frequency operations needed with modern and future high speed switching and computer systems. Another problem arises in ribbon cables having multiple metallic conductors and optical fibers and in the independent optical fibers and coaxial conductors of optical and coaxial cables in controlling both the loss and skew of transmitting digital signals on parallel conductors and optical fibers. Yet another problem arises in using present circuit board coaxial transmission lines due to both the loss and skew characteristics inherent in long lengths of transmission lines required to interconnect high speed computer and switching systems. Other problems arise with strip line cables having conductors tightly coupled through a shield in that differential signals appearing on conductors are effectively cancelled thereby making these type of transmission lines unsuitable for differential signal transmission. Problems also arise with present flexible cables in that conductors embedded within an insulating material located between shields makes it difficult to control both the cable characteristic impedance and crosstalk between conductors. Accordingly, a need exists for a flexible thin film multi-conductor transmission line capable of transmitting parallel digital data over distances ranging from 1 to 100 or more meters with a channel data rate of at least 50 Mb/s with a minimum coupling between conductors and a protecting shield and a minimum of crosstalk while still maintaining a flexible transmission line.

SOLUTION

The foregoing problems and others are solved by a thin film flexible transmission line capable of transmitting coupled and uncoupled data over long distances with a minimum loss, crosstalk and skew while reducing radiation emissions into the surrounding environment and minimizing noise sensitivity of the transmission line from external emission sources. The transmission line of the instant invention comprises a member having a ground plane formed of an electrical conducting material such as copper deposited on one surface thereof. An array of conductors such as single and pairs of parallel conductors wherein each conductor is formed of an electrical conducting material such as copper is deposited on another surface of the member opposite the ground plane with each conductor of a generally rectangular configuration having a width W and a height $h_1$. The member is formed of a flexible film material such as polyimide, but not limited thereto, for electrically insulating the conductors from the ground plane.

A floating flexible shield formed of a material such as copper is positioned above the conductors for maintaining a constant transmission line impedance and for reducing radiation emissions from the conductors into the surrounding environment and minimizing noise sensitivity of the conductors from external emission sources. Insulating material having a dielectric constant $\epsilon_{r2}$, preferably less than a dielectric constant $\epsilon_{r1}$ of the insulating member, and a height $h_3$, is positioned about the sides of and in between the conductors and the shield and supports the shield independent of the conductors. The ratio of the insulating material height $h_3$ to insulating member 10 height $h_2$ is greater than 2 but less than a predetermined value thereby enabling the insulating material to insulate each conductor and the conductors from the shield and minimize electrical crosstalk between the conductors while maintaining a flexible transmission line.

A flexible thin film transmission line in accordance with an embodiment of the invention may typically have an interconnection density of at least 24 conductors per inch and a signal bandwidth of 500 Mb/s for distances of 10 meters. The transmission line may be fabricated using a continuous thin film batch process and have an array of pairs of conductors. Proper waveguiding is insured by using a continuous ground plane for all conductors. Typically, the pair conductors have even and odd mode impedances of approximately 75 and 50 ohms, respectively. The flexible thin film transmission line structure has an insulating member which may be polyimide with a low dielectric loss and a novel floating shield that maintains the even and odd mode impedances independent of flexing of the transmission line and physical environment. The shield also reduces electromagnetic interference and generates better than 30 dB of isolation between conductor pairs. The choice of an insulating material having relatively low dielectric loss and of precise photolithographicaly definable conductors of width and height of around 250 $\mu$m and 25 $\mu$m, respectively, results in an approximate dielectric and conductor loss of 0.78 and 1.4 dB per meter at a frequency of 500 MHz.

In one embodiment of the invention, driver and receiver circuits are positioned at each end of the transmission line respectively and integrated within the transmission line. The outputs of each driver circuit are coupled respectively with one end of each conductor thereby enabling the driver circuit to propagate digital signals generated by signal sources on the conductors connected with the driver circuit. The inputs of each receiver circuit are coupled with the opposite end of each conductor thereby enabling the receiver circuit to receive the propagated digital signals on the conductors. Connectors are integrated within the transmission line with ones of the connectors located at each end of the transmission line. One connector is connected to inputs of the driver circuits thereby enabling the signal sources to be coupled to the transmission line. Another connector is connected with outputs of the receiver circuits for coupling the transmission line to signal destinations.

In another embodiment of the invention, interconnected and aligned receiver and driver circuits each having receiver outputs coupled with corresponding driver inputs are integrated within the transmission line at predefined locations along the length of the conductor pairs. The inputs of each receiver circuit are connected with ends of conductors connected to a preceding driver circuit for receiving propagated signals appearing on the conductors. The outputs of each driver circuit are connected with ends of conductors connected to a succeeding receiver circuit for receiving and regenerating the received signals and propagating them on the transmission line conductors.

In yet another embodiment of the invention, paddle boards mounting driver circuits each having outputs thereof coupled with one end of conductors and receiver circuits each having inputs thereof coupled with another end of conductors coupled with a preceding driver circuit may be located at each end of the transmission line. Each paddle board mounts connectors connected with inputs of the driver circuits and with outputs of the receiver circuits and function for coupling signal sources and signal destinations with the transmission line.

DETAILED DESCRIPTION

Figure 1:
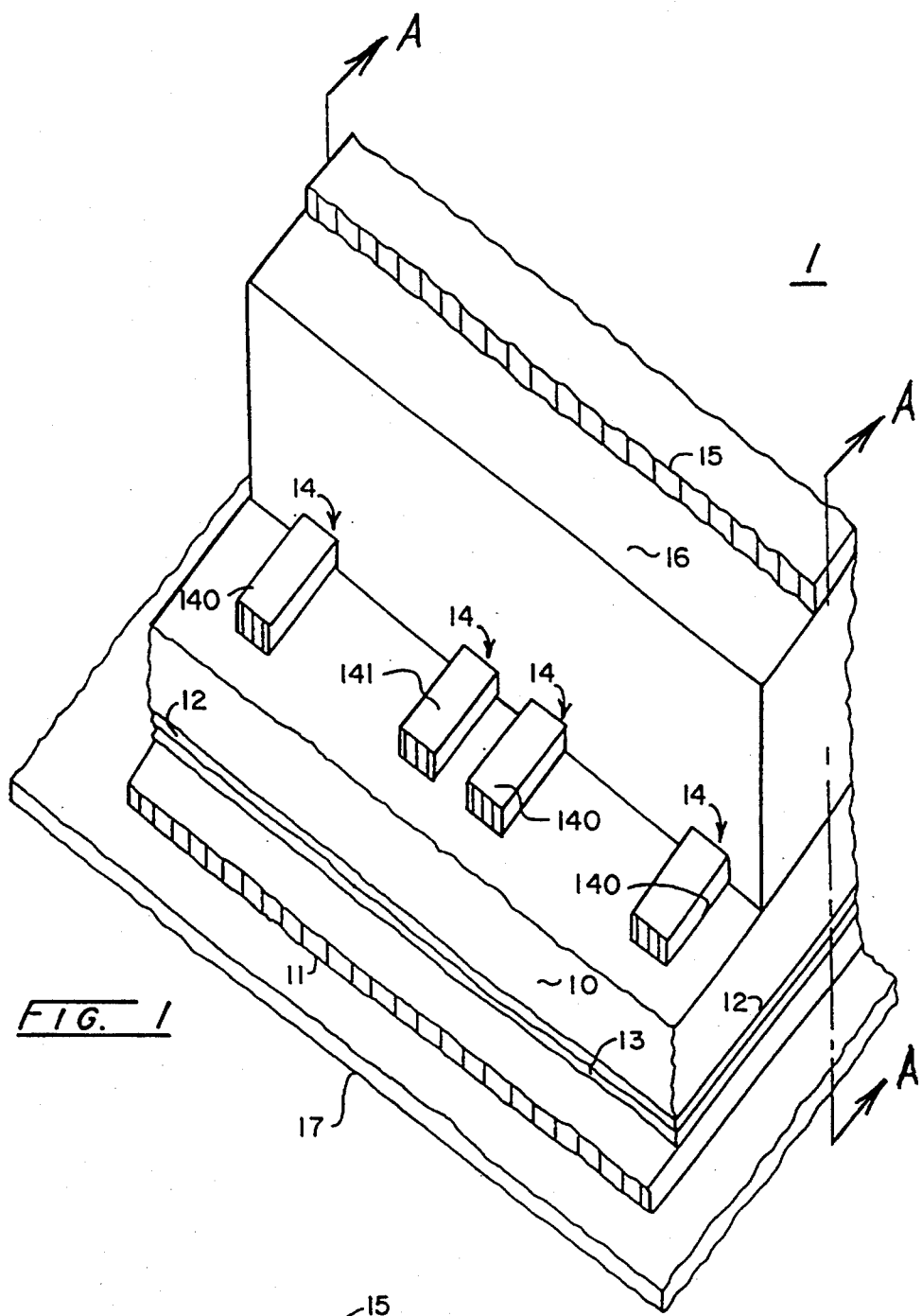
FIG. 1 is a partial cut-away view of a flexible thin film multi-conductor transmission line structure embodying principles of the invention.

In an exemplary embodiment of the invention, FIG. 1 sets forth a flexible thin film passive multi-conductor transmission line 1 in accordance with principles of the invention. Transmission line 1 comprises a dielectric layer formed, but not limited thereto, of an insulating material such as a flexible polyimide film enabling repeated flexing of transmission line 1 without fatigue and having a dielectric constant $\epsilon_{r1}$, which is located between ground plane 11 and an array of single or pairs and combinations of single and pairs of conductors 14. In one embodiment of the invention the dielectric layer may be directly bonded by any one of a number of well known methods to ground plane 11. In another embodiment of the invention, the dielectric layer may, although not limited thereto, be bonded to ground plane 11 using adhesives which may be comprised of one or several layers 12 and 13.

Ground plane 11 is formed of an electrical conducting material such as copper and may be deposited on a medium, preferably flexible, such as circuit member 17. In another structure in accordance with the invention, the dielectric layer may be a rectangular configured member typically formed of insulating material having ground plane 11 formed or deposited on one surface thereof and which may be, although not limited thereto, formed in certain circumstances on a flexible circuit member 17 with ground plane 11 located between the dielectric layer and circuit member 17. Each conductor 140, 141 may be a single conductor or coupled and uncoupled conductors of a parallel conductor pair 14 formed of an electrical conducting material such as copper deposited on another surface of the flexible thin film dielectric layer opposite ground plane 11 and may, although not necessarily limited thereto, have a rectangular configured cross section of width W and height $h_1$. Transmission line 1 may have coupled differential signal pairs 14 with each pair 14 having two parallel conductors 140, 141 each separated from the other by a predefined distance $X_1$ preferably less than a distance $X_2$ separating the signal pairs 14 for minimizing crosstalk between coupled differential signal pairs 14.

The dielectric layer, hereinafter referred to as insulating member 10, electrically insulates conductors 140, 141 and the array of parallel conductor pairs 14 from ground plane 11 and is of a height $h_2$ defining the distance between ground plane 11 and conductors 140, 141 and parallel conductor pairs 14. The characteristic impedance of a transmission line 1 represented by twin conductors 140, 141 of a parallel conductor pair 14 is determined by the distance $X_1$ between each conductor 140, 141 of a conductor pair 14, the distance $X_2$ between conductor pairs 14, the width W and height $h_1$, of a conductor 140, 141, the thickness or height $h_3$ and a dielectric constant $\epsilon_{r2}$ of insulating material 16 preferably less than dielectric constant $\epsilon_{r1}$ of insulating member 10 having a height $h_2$. In a transmission line structure wherein an adhesive is used to bond polyimide member 10 to ground plane 11, the adhesive layers 12, 13 are typically less than 25 $\mu$m in thickness.

Figure 2:
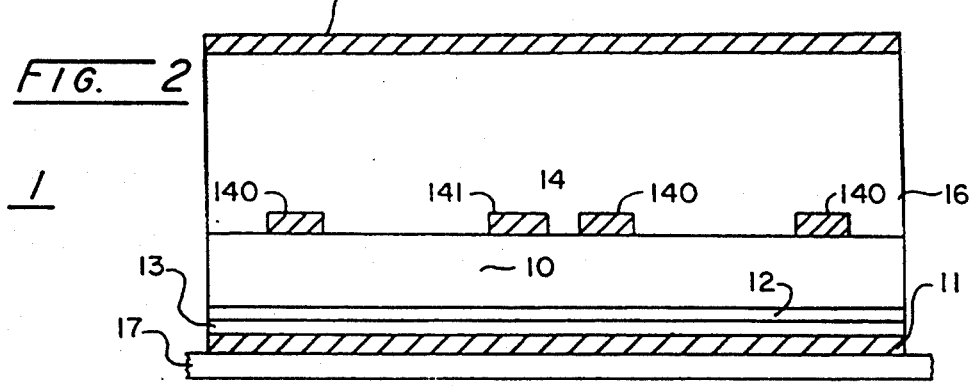
FIG. 2 illustrates a sectional view along line A—A of the flexible thin film transmission line structure set forth in FIG. 1, FIG. 3 sets forth of an illustrative schematic of the flexible thin film transmission line set forth in FIGS. 1 and 2 having active components mounted on paddle circuit boards, and FIG. 4 sets forth an illustrative structure of an active flexible thin film transmission line having active circuits and components integrated within the transmission line structure set forth in FIG. 1.

To reduce emissions from electromagnetic radiation generated by signals appearing on conductors 140, 141 from being propagated into the surrounding environment and to minimize noise sensitivity from external emission sources that may affect the conductor signals, shield 15, FIG. 2, made of an electrical conducting material such as copper, is positioned above conductors 140, 141 and the array of conductor pairs 14 and is incorporated into transmission line 1. Positioned between shield 15 and conductors 140, 141, insulating material 16 having a relatively low dielectric constant $\epsilon_{r2}$ and a thickness or height $h_3$, is positioned about sides of and in between conductors 140, 141 and shield 15 and serves to insulate each conductor 140, 141 from shield 15. The milo of insulating material 16 height $h_3$, to insulating member 10 height $h_2$ is selected as having values greater than 2 between a set of predetermined values such as 2 and 5 but not limited thereto. The use of the thin film process enables the ratio $h_3/h_1$ to be controlled thereby insuring a precise line impedance. In a typical transmission line 1 structure representative of the instant invention, each conductor 140, 141 is formed with a conductor width W of 250 $\mu$m and a height $h_1$ of 25 $\mu$m. With insulating member 10 having a dielectric constant $\epsilon_{r1}$ of 3.2 and formed having a height $h_2$ of 125 $\mu$m, the sum of the dielectric and conductor loss at 500 MHZ is approximately 2.2 dB for each meter of length of transmission line 1.

It is recognized that access to the high bandwidth capability of thin film flexible transmission lines is limited by electrical discontinuities and is inevitable when transitioning from thin film to thick film microstrip or to coaxial connector assemblies. For this reason in the past it has been necessary to incorporate line drivers on printed circuit boards of the systems to drive interconnect parasistics such as connector capacitance. Costly controlled impedance connectors were previously required to be used between a thin film transmission line and interconnected circuit boards to minimize electrical discontinuities between the transmission line and the drivers on the circuit boards. A thin film flexible transmission line incorporating active electronic components eliminates the need for controlled impedance connectors and enables data to be transmitted at a Gb/s rate over distances exceeding 10 meters with negligible loss and skew.

Figure 3:
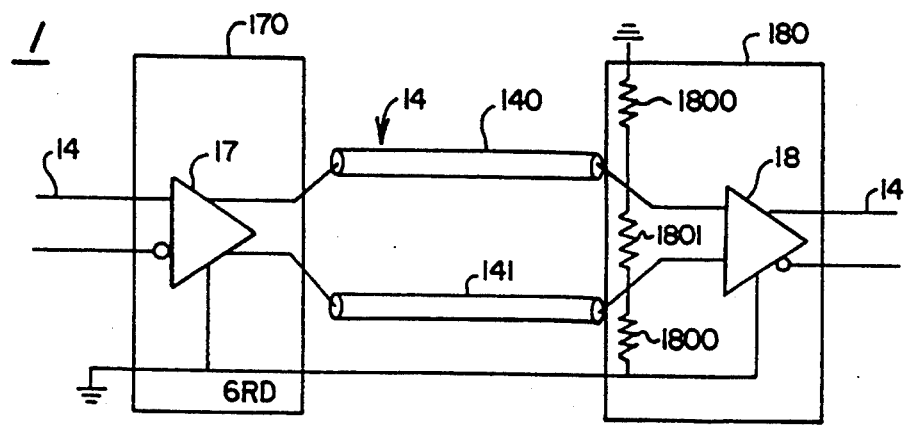

FIG. 3 shows a circuit schematic of transmission line 1 containing active electronic components. Such electronic components, therein represented as driver circuit 17 and receiver circuit 18, are well known and do not require detailed explanation as to their operation. In particular, transmission line 1, FIG. 4, may have conductors 140, 141 and conductor pairs 14 or the inputs and outputs of driver circuits 17 and receiver circuits 18 attached to low cost solder or crimp DIN connectors 20. Thus, transmission line 1, FIGS. 3 and 4, may incorporate a driver circuit 17 and a receiver circuit 18 connected to conductors 140, 141 or a conductor pair 14 so that single and full duplex data transfer can be supported. The integration of driver circuit 17 and receiver circuit 18 into an active structure of transmission line 1 can be achieved in several preferred ways. In one embodiment of the invention, FIG. 3, packaged or unpackaged integrated driver 17 and receiver 18 circuits and ancillary passive electronic components such as resistor elements 1800, 1801 and the like are mounted on small paddle boards 170, 180. Paddle boards 170, 180 act as the interface between connectors 20 and transmission line conductors 140, 141 of a conductor pair 14 and may mount driver or receiver circuits 17, 18 or combinations thereof.

Bare semiconductor elements may be flip-bonded directly onto paddle boards 170, 180 to maintain an extremely low height profile structure of transmission line 1. The driver and receiver circuits 17, 18 mounted on paddle boards 170, 180 function to amplify signals attenuated by conductors 140, 141 and perform bit regeneration. Conductors 140, 141 of a conductor pair 14 and ground plane 11 may be soldered to paddle boards 170, 180 to preserve transmission line conductor characteristic impedance at the inputs and outputs of driver and receiver circuits 17, 18, respectively.

Figure 4:
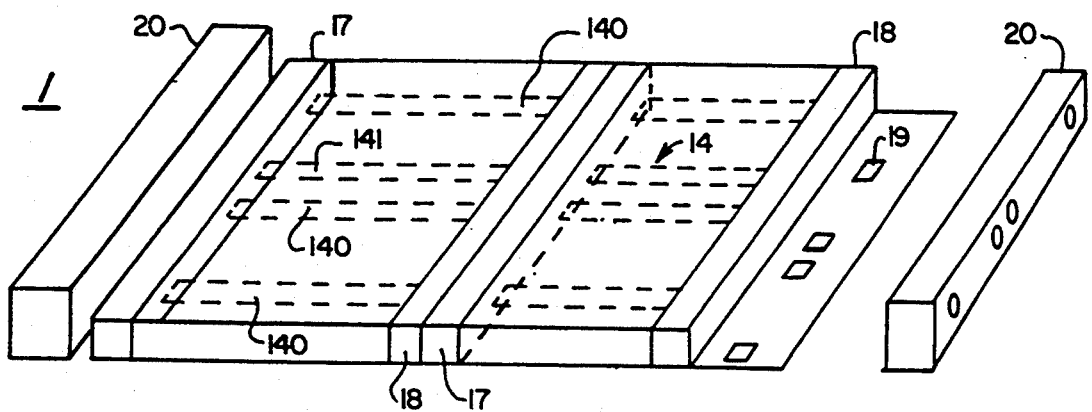

In yet another embodiment of the invention, paddle boards 170, 180 may be eliminated, FIG. 4, and packaged or unpackaged integrated circuits such as driver circuits 17, receiver circuits 18, resistors 1800, 1801 set forth in FIG. 3 and which may be included within receiver circuits 18 of FIG. 4, connectors 20 mounted on termination pads 19 coupled with driver and receiver circuits 17, 18 and other components may be mounted by either surface or chip bonding directly in transmission line structure 1 thereby forming a flexible active transmission line 1. In this embodiment, active components can be integrated at any point along conductors 140, 141 between connectors 20. Using this structure, combinations of interconnected driver and receiver circuits 17, 18 or other types of gain elements can be distributed along conductors 140, 141 of conductor pair 14 thereby enabling the use of much longer transmission line lengths than possible using the paddle board structure set forth in FIG. 3. Both signal amplification and data registration may be performed at each driver and receiver circuits 17, 18 or gain element combination configured in the structure of active transmission line 1.

SUMMARY

It is obvious from the foregoing that the facility, economy and efficiency of transmission lines may be substantially enhanced by flexible multi-conductor thin film passive and active transmission line structures for enabling high speed data to be transmitted between equipment frames and circuit elements of computer and telephone switching systems with a low level of loss. Furthermore, high speed transmission lines may be substantially improved by an active flexible thin film transmission line structure having embedded low cost connectors at ends of the transmission line conductors and integrated line drivers and receivers positioned between the transmission line conductors and the connectors and along the transmission line thereby eliminating prior problems associated with connector and conductor electrical discontinuities. Thus, high speed data can be properly registered and transmitted along such transmission lines relatively jitter free and at a low loss between equipment frames and circuit elements of computer and switching equipment.

I claim:

1. A thin film flexible transmission line comprising
   a thin film member having a continuous ground plane formed on one surface thereof and uncoupled parallel conductors formed on another surface thereof opposite said ground plane and formed for electrically insulating said conductors from said ground plane,
   a floating flexible shield positioned above said conductors for maintaining a constant transmission line impedance and for reducing conductor radiation emissions into the surrounding environment and minimizing noise sensitivity from external emission sources, and insulating material having a dielectric constant less than a dielectric constant of said thin film member and positioned about sides of and in between said conductors and said shield wherein a ratio of a height of said insulating material to a height of said insulating member is greater than 2 for supporting said shield and minimizing coupling between said conductors and said shield while maintaining a flexibility of the transmission line.

2. The thin film flexible transmission line set forth in claim 1 wherein each of said conductors is formed of an electrically conducting material deposited on the other surface of said insulating member as a generally rectangular configuration having a width and a height $h_1$ for transmitting coded and uncoded electrical signals generated by a signal source coupled with one of said conductors independent of adjacent conductors to a signal destination terminating said one conductor.

3. The thin film flexible transmission line set forth in claim 2 wherein said insulating member is formed of a material of a predefined dielectric constant $\epsilon_{r1}$ and loss and bonded to said ground plane with a height of $h_2$ for insulating each of said conductors from said ground plane.

4. The thin film flexible transmission line set forth in claim 3 wherein said insulating member is formed of a low electrical loss thin film material for enabling repeated flexing of the transmission line without fatigue and change in electrical properties of the transmission line.

5. The thin film flexible transmission line set forth in claim 2 wherein said insulating material is formed of a thin film material having a height $h_3$ for insulating said conductors from said shield and for supporting said shield and minimizing electrical crosstalk between said conductors.

6. The thin film flexible transmission line set forth in claim 2 further comprising paddle boards mounting a driver circuit having outputs thereof each coupled with one end of said conductors and mounting a connector connected to inputs of said driver circuit for coupling said signal source with said conductors and mounting a receiver circuit having inputs thereof coupled with another end of each conductor and mounting a connector connected to outputs of said receiver circuit for coupling said signal destination to said conductors.

7. The thin film flexible transmission line set forth in claim 2 further comprising a driver circuit embedded within the transmission line and having outputs thereof coupled with one end of each conductor for propagating independent signals on each said conductor, and a receiver circuit embedded within the transmission line and having inputs thereof coupled with another end of each conductor for receiving the signals propagated on said conductors.

8. The thin film flexible transmission line set forth in claim 7 further comprising a pair of connectors embedded within the transmission line with one of said connectors connected to inputs of said driver circuit for coupling said signal source to the transmission line and with another one of said connectors connected with outputs of said receiver circuit for coupling the transmission line to said signal destination.

9. The thin film flexible transmission line set forth in claim 8 further comprising interconnected receiver and driver circuits having receiver outputs coupled with driver inputs and embedded within the transmission line at predefined locations along said transmission line with inputs thereof connected with said other end of first ones of said conductors for receiving propagated signals appearing on said first conductors and with outputs thereof connected with one end of second ones of said conductors for propagating said received signals on said second conductors.

10. A transmission line structure comprising a continuous ground plane formed of an electrical conducting material, an array of conductor pairs formed of said electrical conducting material and having conductors each of a width and a height $h_1$ for transmitting electric signals, a flexible floating shield formed of said electrical conducting material positioned above said array of conductor pairs for maintaining a constant transmission line impedance and for reducing conductor radiation emissions into the surrounding environment and for minimizing noise sensitivity of said conductors from external emission sources, a member formed of insulating film material having a first dielectric constant $\epsilon_{r1}$ and a height $h_2$ and mounting said ground plane on one surface thereof and mounting said conductors on another surface thereof opposite said one surface mounting said ground plane for electrically insulating said conductors from said ground plane, and insulating material having a second dielectric constant $\epsilon_{r2}$ less than said first dielectric constant $\epsilon_{r1}$ and a height $h_3$ and positioned about the sides of and in between said conductors and said shield wherein a ratio of said insulating material height $h_3$ to said insulating member height $h_2$ is greater than 2 for insulating said conductors and said conductor pairs from said shield and for supporting said shield and minimizing electrical crosstalk between each of said conductors and conductor pairs while maintaining a flexibility of the transmission line.

11. The thin film flexible transmission line set forth in claim 10 wherein said array comprises coupled differential signal pairs with each pair having two parallel conductors each separated from the other by a predefined distance $X_1$ preferably less than a distance $X_2$ separating said signal pairs for minimizing crosstalk between said coupled differential signal pairs.

12. A thin film flexible twin conductor transmission line comprising a thin film member having a copper ground plane deposited on one surface thereof and an array of pairs of uncoupled parallel copper conductors wherein each conductor is formed of copper deposited on another surface of said member opposite said copper ground plane as a generally rectangular configuration having a width and a height $h_1$ wherein said member is formed of a flexible film material for electrically insulating said conductors from said copper ground plane, a floating flexible copper shield positioned above said conductors for maintaining a constant transmission line impedance and for reducing radiation emissions from said conductors into the surrounding environment and minimizing noise sensitivity of said conductors from external emission sources, and insulating material formed of a material having a relatively low dielectric constant and a height $h_3$ wherein a ratio of said insulating material height $h_3$ to a height $h_2$ of said insulating member is greater than 2 and wherein said insulating material is positioned about sides of and in between said conductors and said shield for supporting said shield independent of said array of conductors while maintaining a flexibility of the transmission line and insulating each of said conductors and said array of conductors from said shield.

13. A thin film flexible twin conductor transmission line comprising
- a thin film member having a copper ground plane deposited on one surface thereof and an array of pairs of parallel copper conductors wherein each conductor is formed of copper deposited on another surface of said member opposite said ground plane as a generally rectangular configuration having a width and a height $h_1$ wherein said member is formed of a flexible film material for electrically insulating said conductors from said ground plane,
- a floating flexible copper shield positioned above said array of conductors for maintaining a constant transmission line impedance and for reducing radiation emissions from said conductors into the surrounding environment and minimizing noise sensitivity of said conductors from external emission sources,
- insulating material formed of a material having a relatively low dielectric constant and a height $h_3$ wherein a ratio of said insulating material height $h_3$ to a height $h_2$ of said insulating member is greater than 2 for minimizing coupling between said conductors and said shield and wherein said insulating material is positioned about sides of and in between said conductors and said shield for supporting said shield independent of said array of conductors while maintaining a flexibility of the transmission line and for insulating each of said conductors and said array of conductors from said shield, and
- paddle boards mounting driver circuits each having outputs thereof coupled with one ends of said conductors and receiver circuits each having inputs thereof coupled with other ends of said conductors and mounting connectors connected to inputs of said driver circuits and to outputs of said receiver circuits for coupling signal sources and destinations with the transmission line.

14. A thin film flexible twin conductor transmission line comprising
- a thin film member having a copper ground plane deposited on one surface thereof and an array of pairs of parallel copper conductors wherein each conductor is formed of copper deposited on another surface of said member opposite said ground plane as a generally rectangular configuration having a width and a height $h_1$ wherein said member is formed of a flexible film material for electrically insulating said conductors from said ground plane,
- a floating flexible copper shield positioned above said array of conductors for maintaining a constant transmission line impedance and for reducing radiation emissions from said conductors into the surrounding environment and minimizing noise sensitivity of said conductors from external emission sources,
- insulating material formed of a material having a relatively low dielectric constant and a height $h_3$ wherein a ratio of said insulating material height $h_3$ to a height $h_2$ of said insulating member is greater than 2 for minimizing coupling between said conductors and said shield and wherein said insulating material is positioned about sides of and in between said conductors and said shield for supporting said shield independent of said array of conductors while maintaining a flexibility of the transmission line and for insulating each of said conductors and said array of conductors from said shield,
- a plurality of aligned driver circuits integrated within the transmission line and having outputs thereof each coupled with one end of each said conductor for propagating digital signals on said conductors,
- a plurality of aligned receiver circuits integrated within the transmission line and having inputs thereof each coupled with another end of each said conductor for receiving the propagated digital signals on said conductors, and
- connectors integrated within the transmission line and connected to inputs of said driver circuits for coupling signal sources to the transmission line and connected with outputs of said receiver circuits for coupling the transmission line to signal destinations.

15. A thin film flexible twin conductor transmission line comprising
- a thin film member having a copper ground plane deposited on one surface thereof and an array of pairs of parallel copper conductors wherein each conductor is formed of copper deposited on another surface of said member opposite said ground plane as a generally rectangular configuration having a width and a height $h_1$ wherein said member is formed of a flexible film material for electrically insulating said conductors from said ground plane,
- a floating flexible copper shield positioned above said array of conductors for maintaining a constant transmission line impedance and for reducing radiation emissions from said conductors into the surrounding environment and minimizing noise sensitivity of said conductors from external emission sources,
- insulating material formed of a material having a relatively low dielectric constant and a height $h_3$ wherein a ratio of said insulating material height $h_3$ to a height $h_2$ of said insulating member is greater than 2 for minimizing coupling between said conductors and said shield and wherein said insulating material is positioned about sides of and in between said conductors and said shield for supporting said shield independent of said array of conductors while maintaining a flexibility of the transmission line and for insulating each of said conductors and said array of conductors from said shield,
- a plurality of aligned driver circuits integrated within the transmission line and having outputs thereof each coupled with one end of each one of a first pair of said conductors for propagating digital signals on said first pair of conductors, a plurality of interconnected aligned receiver and driver circuits each having receiver outputs coupled with corresponding driver inputs and each interconnected receiver and driver circuit integrated within the transmission line at predefined locations along the transmission line with receiver inputs thereof connected with an other end of said first pair of conductors for receiving the propagated digital signals appearing on said first pair of conductors and with driver outputs thereof connected with one end of a second pair of said conductors for propagating the received digital signals on said second conductor pair, a plurality of aligned receiver circuits integrated within the transmission line and having inputs thereof each coupled with another end of said second pair of conductors for receiving the propagated digital signals on said second conductor pair, and connectors integrated within the transmission line and connected to inputs of said driver circuits for coupling digital signal sources to the transmission line and connected with outputs of said receiver circuits for coupling the transmission line to digital signal destinations.

* * * * *